US008456171B2

(12) United States Patent
Matsuno et al.

(10) Patent No.: US 8,456,171 B2
(45) Date of Patent: Jun. 4, 2013

(54) SEMICONDUCTOR TEST SYSTEM AND RELAY DRIVING TEST METHOD THEREFOR

(75) Inventors: Shingo Matsuno, Hyogo (JP); Kenji Emura, Hyogo (JP); Hiroki Kitamura, Hyogo (JP)

(73) Assignee: Japan Electronic Materials Corp., Hyogo (JP)

( * ) Notice: Subject to any disclaimer, the term of this patent is extended or adjusted under 35 U.S.C. 154(b) by 265 days.

(21) Appl. No.: 13/125,664

(22) PCT Filed: Oct. 16, 2009

(86) PCT No.: PCT/JP2009/067883
§ 371 (c)(1),
(2), (4) Date: Apr. 27, 2011

(87) PCT Pub. No.: WO2010/047275
PCT Pub. Date: Apr. 29, 2010

(65) Prior Publication Data
US 2011/0193562 A1    Aug. 11, 2011

(30) Foreign Application Priority Data
Oct. 24, 2008   (JP) .................................. 2008-273679

(51) Int. Cl.
*G01R 31/02*   (2006.01)

(52) U.S. Cl.
USPC ....... 324/537; 324/500; 324/750.15; 324/418

(58) Field of Classification Search
None
See application file for complete search history.

(56) References Cited

U.S. PATENT DOCUMENTS 6,784,684 B2 *   8/2004   Tanimura ................. 324/756.07

FOREIGN PATENT DOCUMENTS

| JP | 4-203982 | 7/1992 |
|----|----------|--------|
| JP | 11-271398 | 10/1999 |
| JP | 11-316262 | 11/1999 |
| JP | 2000-098000 | 4/2000 |
| JP | 2005-308587 | 11/2005 |

OTHER PUBLICATIONS

International Search Report dated Mar. 16, 2010 in corresponding PCT Application No. PCT/JP2009/067883.

* cited by examiner

*Primary Examiner* — Jermele M Hollington
*Assistant Examiner* — Trung Nguyen
(74) *Attorney, Agent, or Firm* — Faegre Baker Daniels LLP

(57) ABSTRACT

It is aimed to provide a probe card test system and a relay driving test method for probe cards which can automatically and continuously perform tests without bringing needle tips into contact with a number of relays mounted on a probe card and by using a device. In a probe card test system for testing a probe card using a tester, the probe card includes a substrate having a first probe and a first relay connected to the first probe, a relay controller for the first relay and a first measurement channel for connecting the first relay and the first probe to the tester are further provided on the substrate. The tester includes a DC power supply, a control board for controlling the relay controller for the first relay, and a first measurement circuit connected to the first measurement channel, the DC power supply and a voltmeter. The first measurement circuit includes a first resistor having a predetermined time constant and a first changeover switch to be connected to the first measurement channel. The DC power supply and the first resistor are connected to the first changeover switch, and the first measurement channel is switchingly connected to the DC power supply or the first resistor by the first changeover switch.

6 Claims, 8 Drawing Sheets

(a)

(b)

SEMICONDUCTOR TEST SYSTEM AND RELAY DRIVING TEST METHOD THEREFOR

CROSS-REFERENCE TO RELATED APPLICATION

This application is related to and claims the benefit under 35 U.S.C. §119 and 35 U.S.C. §365 of International Application No. PCT/JP2009/067883, filed Oct. 16, 2009, the disclosure of which is expressly incorporated herein by reference.

TECHNICAL FIELD

The present invention relates to a probe card test system and a relay driving test method for a probe card.

BACKGROUND ART

As semiconductor devices have become more integrated in recent years, it has been tried to reduce a unit price by manufacturing a number of dies on one large-diameter wafer and increase test efficiency of a test and reduce cost thereof using a GIST self-test) technology, a BOST (Built-out self test) technology and the like in a wafer testing process.

Accordingly, it has been required to mount special circuits and devices on a probe card used in the wafer testing process. Particularly, a number of relays are required to be mounted on a probe card used in a test for a memory device (see patent literature 1).

Various methods are used for relay driving tests of such probe cards. If a small number of relays are mounted, a manual test is used in which a voltage is applied to a target relay to drive the relay and a handy tester is directly brought into contact with a circuit in this state to test a switch (connection, disconnection) of the circuit by the relay.

Alternatively, a method in which a voltage is applied to a relay control channel and a check terminal is automatically brought into contact with a needle tip of a probe connected to a target channel to test a switch (connection, disconnection) of a circuit between the needle tip and a substrate pad is also used as a testing method using a device.

In the case of a probe card mounted with a number of relays, a main substrate and sub-substrates have been individually tested since the probe card is composed of the main substrate and the sub-substrates each formed into a module by having a plurality of relays mounted thereon.

CITATION LIST

Patent Literature

Patent Literature 1 Japanese Unexamined Patent Publication No. H06-151531

SUMMARY OF INVENTION

Technical Problem

Such conventional relay driving tests had several problems. For example, in the case of a manual test, a testing time was long and the test could not be performed depending on the packaging density of products on a probe card in some cases. Further, in the case of a test using a device, there were problems such as capability of driving only relays with specific circuit configurations and damage of needle tips since the test was performed while the corresponding needle tips were individually brought into contact.

In the case of a relay driving test of a probe card mounted with a number of relays, a test could not be fundamentally performed in a final state where sub-substrates formed into modules are combined with a main substrate although individual tests were possible. Thus, relay driving of the probe card could not be guaranteed in a relay mounted state.

Accordingly, in order to solve such conventional problems, the present invention aims to provide a probe card test system and a relay driving test method for probe cards which can automatically and continuously test a probe card without bringing needle tips of probes into contact with a number of relays mounted on the probe card and by using a tester.

Solution to Problem

The present invention is directed to a probe card test system for testing a probe card using a tester, characterized in that the probe card includes a substrate having a first probe and a first relay connected to the first probe, a relay controller for the first relay and a first measurement channel for connecting the first relay and the first probe to the tester are further provided on the substrate, the tester includes a DC power source, a control board for controlling the relay controller for the first relay and a first measurement circuit to be connected to the first measurement channel, the DC power source and a voltmeter, the first measurement circuit includes a first resistor having a predetermined time constant and a first changeover switch to be connected to the first measurement channel, the DC power source and the first resistor are connected to the first changeover switch, and the first measurement channel is switchingly connected to the DC power source or the first resistor by the first changeover switch.

A second probe, a second relay connected to the second probe, a relay controller for the second relay and a second measurement channel for connecting the second relay and the second probe to the tester may be provided on the substrate of the probe card, and a pull-up resistor may be arranged between the second relay and the second probe in the second measurement channel; the tester may include a second measurement circuit with a second resistor having a predetermined time constant and a second changeover switch to be connected to the second measurement channel, the second measurement circuit may be connected to the DC power source and the voltmeter, the DC power source and the second resistor may be connected to the second changeover switch, and the second measurement channel may be switchingly connected to the DC power source or the second resistor by the second changeover switch; and the tester may further include a circuit changeover switch for switching between connection of the first measurement circuit and the voltmeter and connection of the second measurement circuit and the voltmeter and a switch control board for switching connections of the first and second measurement circuits and the first and second channels.

A second probe, a second relay connected to the second probe, a relay controller for the second relay and a second measurement channel for connecting the second relay and the second probe to the tester may be provided on the substrate of the probe card, and a pull-up resistor may be arranged between the second relay and the tester in the second measurement channel; the tester may include a second measurement circuit with a second resistor having a predetermined time constant and a second changeover switch to be connected to the second measurement channel, the second measurement circuit may be connected to the DC power source and the voltmeter, the DC power source and the second resistor may be connected to the second changeover switch, and the second measurement channel may be switchingly connected to the DC power source or the second resistor by the second changeover switch; and the tester may further include a circuit changeover switch for switching between connection of the first measurement circuit and the voltmeter and connection of the second measurement circuit and the voltmeter and a switch control board for switching connections of the first and second measurement circuits and the first and second channels.

The present invention is also directed to a relay driving test method for a probe card using a tester, characterized in that the probe card includes a substrate having a first probe and a first relay connected to the first probe, a relay controller for the first relay and a first measurement channel for connecting the first relay and the first probe to the tester are further provided on the substrate, the tester includes a DC power source, a control board for controlling the relay controller for the first relay and a first measurement circuit to be connected to the first measurement channel, the DC power source and a voltmeter, the first measurement circuit includes a first resistor having a predetermined time constant and a first changeover switch to be connected to the first measurement channel, the DC power source and the first resistor are connected to the first changeover switch, the first measurement channel is switchingly connected to the DC power source or the first resistor by the first changeover switch, a capacitance is charged by turning off the first relay, connecting the first measurement channel to the DC power supply by the first changeover switch and applying a voltage between the first measurement channel and a GND; after charge, the first measurement channel is connected to the first resistor by the first changeover switch to start discharge, time measurement is started simultaneously with the start of the discharge, a discharge voltage during a specified period is measured by the voltmeter, several time and voltage data are sampled to obtain a discharge equation by a least-square method and calculate an electrostatic capacitance Coff when the first relay is turned off; after the completion of the discharge, the capacitance is charged by turning on the first relay by the control board, connecting the first measurement channel to the DC power supply by the first changeover switch and applying a voltage between the first measurement channel and the GND; after charge, the first measurement channel is connected to the first resistor by the first changeover switch to start discharge, time measurement is started simultaneously with the start of the discharge, a discharge voltage during a specified period is measured by the voltmeter, and several time and voltage data are sampled to calculate an electrostatic capacitance Con when the relay is turned on; and a difference between the electrostatic capacitance Con when the first relay is turned on and the electrostatic capacitance Coff when the first relay is turned off is calculated to determine whether or not the operation of the first relay is good.

A second probe, a second relay connected to the second probe, a relay controller for the second relay and a second measurement channel for connecting the second relay and the second probe to the tester may be provided on the substrate of the probe card, a pull-up resistor may be arranged between the second relay and the second probe in the second measurement channel, the tester may include a second measurement circuit with a second resistor having a predetermined time constant and a second changeover switch to be connected to the second measurement channel, the second measurement circuit may be connected to the DC power source and the voltmeter, the DC power source and the second resistor may be connected to the second changeover switch, the second measurement channel may be switchingly connected to the DC power source or the second resistor by the second changeover switch and the tester may further include a circuit changeover switch for switching between connection of the first measurement circuit and the voltmeter and connection of the second measurement circuit and the voltmeter and a switch control board for switching connections of the first and second measurement circuits and the first and second channels. A resistance value of the pull-up resistor may be calculated by connecting the second measurement circuit of the tester and the second measurement channel of the probe card by the switch control board, connecting the second measurement circuit to the voltmeter by the circuit changeover device, turning on the second relay and connecting the second measurement channel to the second resistor by the second changeover switch, and whether or not the operation of the second relay is good may be determined based on the calculated resistance value.

Alternatively, a second probe, a second relay connected to the second probe, a relay controller for the second relay and a second measurement channel for connecting the second relay and the second probe to the tester may be provided on the substrate of the probe card, a pull-up resistor may be arranged between the second relay and the tester in the second measurement channel, the tester may include a second measurement circuit with a second resistor having a predetermined time constant and a second changeover switch to be connected to the second measurement channel, the second measurement circuit may be connected to the DC power source and the voltmeter, the DC power source and the second resistor may be connected to the second changeover switch, the second measurement channel may be switchingly connected to the DC power source or the second resistor by the second changeover switch and the tester may further include a circuit changeover switch for switching between connection of the first measurement circuit and the voltmeter and connection of the second measurement circuit and the voltmeter and a switch control board for switching connections of the first and second measurement circuits and the first and second channels. A resistance value of the pull-up resistor may be calculated by connecting the second measurement circuit of the tester and the second measurement channel of the probe card by the switch control board, connecting the second measurement circuit to the voltmeter by the circuit changeover device, turning off the second relay and connecting the second measurement channel to the second resistor by the second changeover switch. A capacitance may be charged by connecting the second measurement channel to the DC power supply by the second changeover switch with the second relay kept turned off and applying a voltage between the second measurement channel and the GND. After charge, the second measurement channel may be connected to the second resistor by the second changeover switch to start discharge for a specified period, a change in a discharge voltage within the specified period may be measured by the voltmeter and the capacitance may be charged again by connecting the second measurement channel to the DC power supply by the second changeover switch and applying a voltage between the second measurement channel and the GND. The discharge and the charge may be cyclically repeated with the second measurement circuit connected to the voltmeter only during the discharge and an electrostatic capacitance Coff when the second relay is turned off may be calculated based on an average voltage obtained by measuring voltages after the elapse of the specified period from the starts of the discharge and the charge using a voltmeter in which relatively large loads are connected in series. After the calculation of the electrostatic capacitance Coff, the capacitance may be charged by turning on the second relay by the control board, connecting the second measurement channel to the DC power supply by the second changeover switch and applying a voltage between the second measurement channel and the GND. After charge, the second measurement channel may be connected to the second resistor by the second changeover switch to start discharge for a specified period, a change in a discharge voltage within the specified period may be measured by the voltmeter, and the capacitance may be charged again by connecting the second measurement channel to the DC power supply by the second changeover switch and applying a voltage between the second measurement channel and the GND. The discharge and the charge may be cyclically repeated with the second measurement circuit connected to the voltmeter only during the discharge and an electrostatic capacitance Con when the second relay is turned on may be calculated based on an average voltage obtained by measuring voltages after the elapse of the specified period from the starts of the discharge and the charge using a voltmeter in which relatively large loads are connected in series. A difference between the electrostatic capacitance Con when the second relay is turned on and the electrostatic capacitance Coff when the relay is turned off may be calculated to determine whether or not the operation of the second relay is good.

Advantageous Effects of Invention

The probe card test system of the present invention is the probe card test system for testing the probe card using the tester, wherein the probe card includes the substrate having the first probe, the first relay connected to the first probe, the relay controller for the first relay and the first measurement channel for connecting the first relay and the first probe to the tester are further provided on the substrate, the tester includes the DC power source, the control board for controlling the relay controller for the first relay and the first measurement circuit to be connected to the first measurement channel and the DC power supply, the first measurement circuit includes the voltmeter to be connected to the first measurement channel, the first resistor having the predetermined time constant and the first changeover switch to be connected to the first measurement channel, the DC power source and the first resistor are connected to the first changeover switch, and the first measurement channel is switchingly connected to the DC power source or the first resistor by the first changeover switch. Thus, a relay driving test can be performed for the probe card in a relay mounted state.

The second probe, the second relay connected to the second probe, the relay controller for the second relay and the second measurement channel for connecting the second relay and the second probe to the tester are provided on the substrate of the probe card, the pull-up resistor is arranged between the second relay and the second probe in the second measurement channel, the tester includes the second measurement circuit with the second resistor having the predetermined time constant and the second changeover switch to be connected to the second measurement channel, the second measurement circuit is connected to the DC power source and the voltmeter, the DC power source and the second resistor are connected to the second changeover switch, the second measurement channel is switchingly connected to the DC power source or the second resistor by the second changeover switch, and the tester further includes the circuit changeover switch for switching between connection of the first measurement circuit and the voltmeter and connection of the second measurement circuit and the voltmeter and the switch control board for switching connections of the first and second measurement circuits and the first and second channels. Thus, a relay driving test can be performed for the probe card in a relay mounted state.

The second probe, the second relay connected to the second probe, the relay controller for the second relay and the second measurement channel for connecting the second relay and the second probe to the tester are provided on the substrate of the probe card, a pull-up resistor is arranged between the second relay and the tester in the second measurement channel, the tester includes the second measurement circuit with the second resistor having the predetermined time constant and the second changeover switch to be connected to the second measurement channel, the second measurement circuit is connected to the DC power source and the voltmeter, the DC power source and the second resistor are connected to the second changeover switch, the second measurement channel is switchingly connected to the DC power source or the second resistor by the second changeover switch, and the tester further includes the circuit changeover switch for switching between connection of the first measurement circuit and the voltmeter and connection of the second measurement circuit and the voltmeter and the switch control board for switching connections of the first and second measurement circuits and the first and second channels. Thus, a relay driving test can be performed for the probe card in a relay mounted state.

The relay driving test method for probe card of the present invention is the one using the tester, wherein the probe card includes the substrate having the first probe, the first relay connected to the first probe, the relay controller for the first relay and the first measurement channel for connecting the first relay and the first probe to the tester are further provided on the substrate, the tester includes the DC power source, the control board for controlling the relay controller for the first relay and the first measurement circuit to be connected to the first measurement channel, the DC power source and the voltmeter, the first measurement circuit includes the first resistor having the predetermined time constant and the first changeover switch to be connected to the first measurement channel, the DC power source and the first resistor are connected to the first changeover switch, the first measurement channel is switchingly connected to the DC power source or the first resistor by the first changeover switch. The capacitance is charged by turning off the first relay, connecting the first measurement channel to the DC power supply by the first changeover switch and applying the voltage between the first measurement channel and the GND. After the charge, the first measurement channel is connected to the first resistor by the first changeover switch to start the discharge, the time measurement is started simultaneously with the start of the discharge, and the discharge voltage during the specified period is measured by the voltmeter, several time and voltage data are sampled to obtain the discharge equation by the least-square method and calculate the electrostatic capacitance Coff when the first relay is turned off. After the completion of the discharge, the capacitance is charged by turning on the first relay by the control board, connecting the first measurement channel to the DC power supply by the first changeover switch and applying the voltage between the first measurement channel and the GND. After the charge, the first measurement channel is connected to the first resistor by the first changeover switch to start the discharge, the time measurement is started simultaneously with the start of the discharge, the discharge voltage during the specified period is measured by the voltmeter, and several time and voltage data are sampled to calculate the electrostatic capacitance Con when the relay is turned on. The difference between the electrostatic capacitance Con when the first relay is turned on and the electrostatic capacitance Coff when the first relay is turned off is calculated to determine whether or not the operation of the first relay is good. Thus, a relay driving test can be performed for the probe card using the tester, wherefore test efficiency is improved, a relay mounting failure and a defective product can be found after the relay is mounted and reliability of a product is improved.

The second probe, the second relay connected to the second probe, the relay controller for the second relay and the second measurement channel for connecting the second relay and the second probe to the tester are provided on the substrate of the probe card, the pull-up resistor is arranged between the second relay and the second probe in the second measurement channel, the tester includes the second measurement circuit with the second resistor having the predetermined time constant and the second changeover switch to be connected to the second measurement channel, the second measurement circuit is connected to the DC power source and the voltmeter, the DC power source and the second resistor are connected to the second changeover switch, the second measurement channel is switchingly connected to the DC power source or the second resistor by the second changeover switch, and the tester further includes the circuit changeover switch for switching between connection of the first measurement circuit and the voltmeter and connection of the second measurement circuit and the voltmeter and the switch control board for switching connections of the first and second measurement circuits and the first and second channels. The resistance value of the pull-up resistor is calculated by connecting the second measurement circuit of the tester and the second measurement channel of the probe card by the switch control board, connecting the second measurement circuit to the voltmeter by the circuit changeover device, turning on the second relay and connecting the second measurement channel to the second resistor by the second changeover switch, and whether or not the operation of the second relay is good is determined based on the calculated resistance value. Thus, a relay driving test can be performed for the probe card in a relay mounted state.

Alternatively, the second probe, the second relay connected to the second probe, the relay controller for the second relay and the second measurement channel for connecting the second relay and the second probe to the tester are provided on the substrate of the probe card, the pull-up resistor is arranged between the second relay and the tester in the second measurement channel, the tester includes the second measurement circuit with the second resistor having the predetermined time constant and the second changeover switch to be connected to the second measurement channel, the second measurement circuit is connected to the DC power source and the voltmeter, the DC power source and the second resistor are connected to the second changeover switch, the second measurement channel is switchingly connected to the DC power source or the second resistor by the second changeover switch and the tester further includes the circuit changeover switch for switching between connection of the first measurement circuit and the voltmeter and connection of the second measurement circuit and the voltmeter and the switch control board for switching connections of the first and second measurement circuits and the first and second channels. The resistance value of the pull-up resistor is calculated by connecting the second measurement circuit of the tester and the second measurement channel of the probe card by the switch control board, connecting the second measurement circuit to the voltmeter by the circuit changeover device, turning off the second relay and connecting the second measurement channel to the second resistor by the second changeover switch. The capacitance is charged by connecting the second measurement channel to the DC power supply by the second changeover switch with the second relay kept turned off and applying the voltage between the second measurement channel and the GND. After the charge, the second measurement channel is connected to the second resistor by the second changeover switch to start the discharge for the specified period, the change in the discharge voltage within the specified period is measured by the voltmeter and the capacitance is charged again by connecting the second measurement channel to the DC power supply by the second changeover switch and applying the voltage between the second measurement channel and the GND. The discharge and the charge are cyclically repeated with the second measurement circuit connected to the voltmeter only during the discharge and the electrostatic capacitance Coff when the second relay is turned off is calculated based on the average voltage obtained by measuring the voltages after the elapse of the specified period from the starts of the discharge and the charge using the voltmeter in which relatively large loads are connected in series. After the calculation of the electrostatic capacitance Coff, the capacitance is charged by turning on the second relay by the control board, connecting the second measurement channel to the DC power supply by the second changeover switch and applying the voltage between the second measurement channel and the GND. After the charge, the second measurement channel is connected to the second resistor by the second changeover switch to start the discharge for the specified period, the change in the discharge voltage within the specified period is measured by the voltmeter, and the capacitance is charged again by connecting the second measurement channel to the DC power supply by the second changeover switch and applying the voltage between the second measurement channel and the GND. The discharge and the charge are cyclically repeated with the second measurement circuit connected to the voltmeter only during the discharge and the electrostatic capacitance Con when the second relay is turned on is calculated based on the average voltage obtained by measuring the voltages after the elapse of the specified period from the starts of the discharge and the charge using the voltmeter in which relatively large loads are connected in series. The difference between the electrostatic capacitance Con when the second relay is turned on and the electrostatic capacitance Coff when the second relay is turned off is calculated to determine whether or not the operation of the second relay is good. Thus, a relay driving test can be performed for the probe card in a relay mounted state.

BRIEF DESCRIPTION OF DRAWINGS

FIG. 9 is a diagram of the probe card test system according to the third embodiment of the present invention showing a state where a capacitance is charged with the relay turned off, FIG. 10 are graphs showing a voltage change when discharge and charge are cyclically repeated in the probe card test system according to the third embodiment, wherein

EMBODIMENTS OF INVENTION

Figure 1:
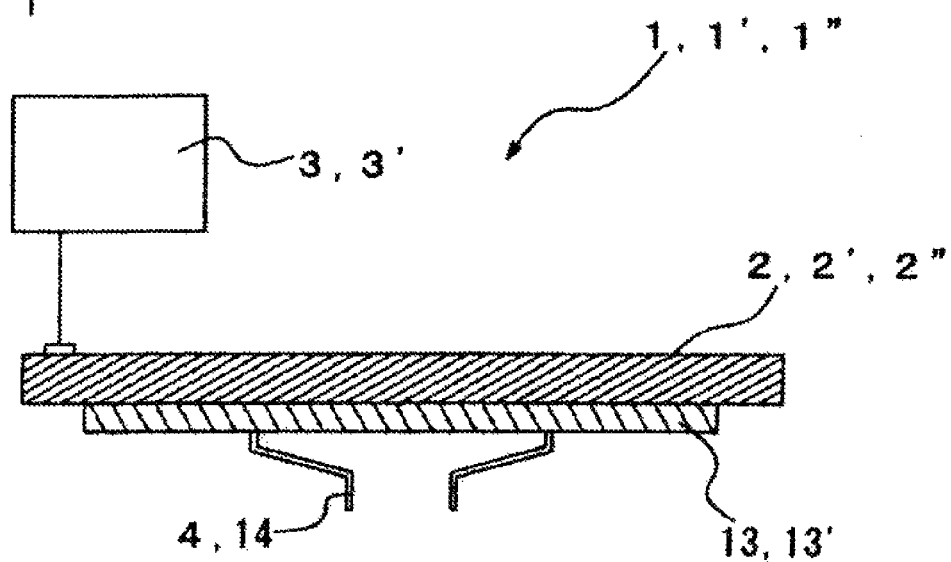
FIG. 1 is a schematic construction diagram of a probe card test system of the present invention.
Figure 2:
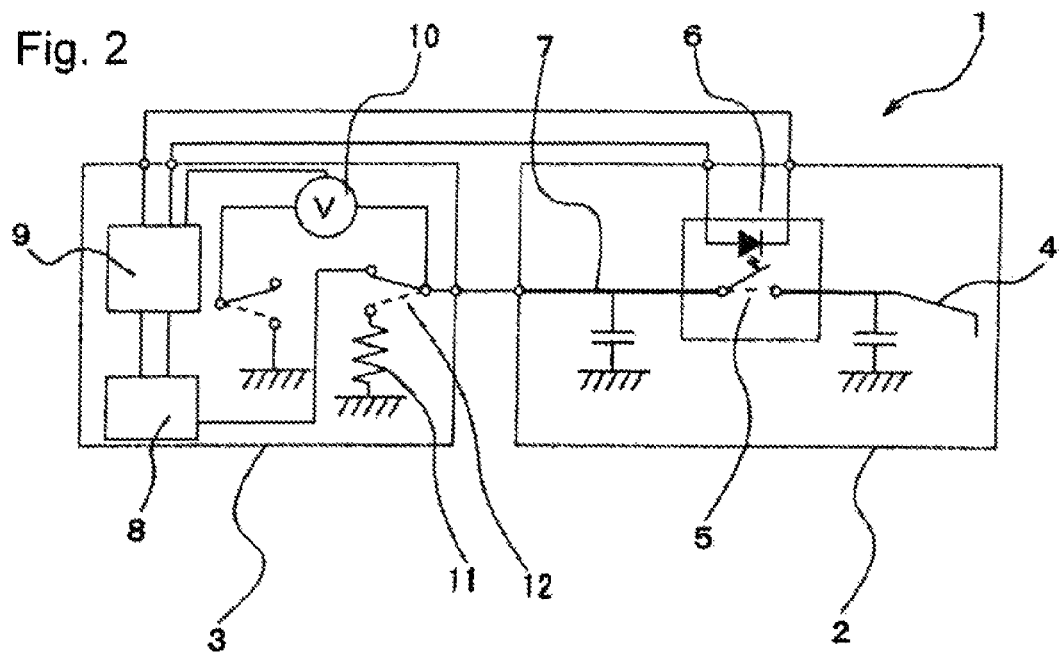
FIG. 2 is a diagram of a probe card test system according to a first embodiment of the present invention showing a state where a capacitance is charged with a relay turned off.

A probe card test system 1 of the present invention is described in detail with reference to the drawings. What is shown in FIG. 1 is a schematic construction diagram of the probe card test system 1 according to the first embodiment, and what is shown in FIG. 2 is a diagram of the probe card test system 1.

The probe card test system 1 according to the first embodiment of the present invention includes a probe card 2 and a tester 3, and the probe card 2 includes a substrate 13 having a first probe 4. A first relay 5 connected to the first probe 4, a first relay controller 6 for the first relay 5 and a first measurement channel 7 to be connected to the first relay 5 are provided on the substrate 13.

The tester 3 includes a DC power supply 8, a control board 9, a voltmeter 10, a first range resistor 11 having a predetermined time constant and a first changeover switch 12. The DC power supply 8 is connected to the control board 9 and the first measurement channel 7, and connection to the first measurement channel 7 is carried out via the first changeover switch 12. The control board 9, the first range resistor 11 and the first changeover switch 12 may be mounted on the probe card 2.

The control board 9 controls the operation of the first relay controller 6 and switches on and off states of the first relay 5. The first changeover switch 12 is provided to switch between connection of the first measurement channel 7 to the DC power supply 8 and that to the first range resistor 11. The voltmeter 10 is connected to the first measurement channel 7 and measures a voltage when the first measurement channel 7 is connected to the first range resistor 11 by the first changeover switch 12.

By constructing the probe card test system 1 as described above, it becomes possible to automatically and continuously perform relay driving tests with relays mounted on the probe card 2. A relay driving test method for the probe card test system 1 is described in detail below.

In the probe card test system 1, a voltage of 3.3 V is applied between the first measurement channel 7 and a GND to charge a capacitance with the first relay 5 turned of and the first measurement channel 7 connected to the DC power supply 8 by the first changeover switch 12 (state shown in FIG. 2). The capacitance is the sum of a line capacitance, i.e. so-called stray capacitance and a capacitance of a capacitor mounted as a part.

Figure 3:
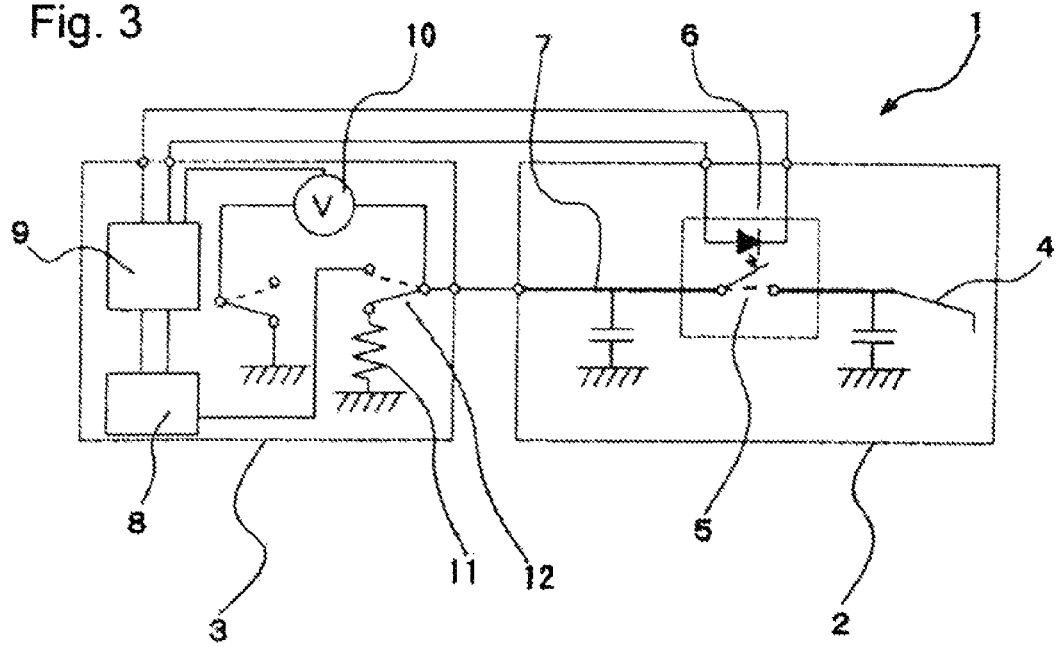
FIG. 3 is a diagram of the probe card test system showing a discharging state with the relay turned off.

When the capacitance is charged, the connection of the first measurement channel 7 is switched from the connection to the DC power supply 8 to that to the first range resistor 11 by the first changeover switch 12 and discharge is started in a state shown in FIG. 3. The control board 9 starts measuring time simultaneously with the start of the discharge, a discharge voltage during a specified period is measured by the voltmeter 10, several time and voltage data are sampled to obtain a discharge equation by a least-square method and an electrostatic capacitance Coff when the first relay 5 is turned off is calculated.

Figure 4:
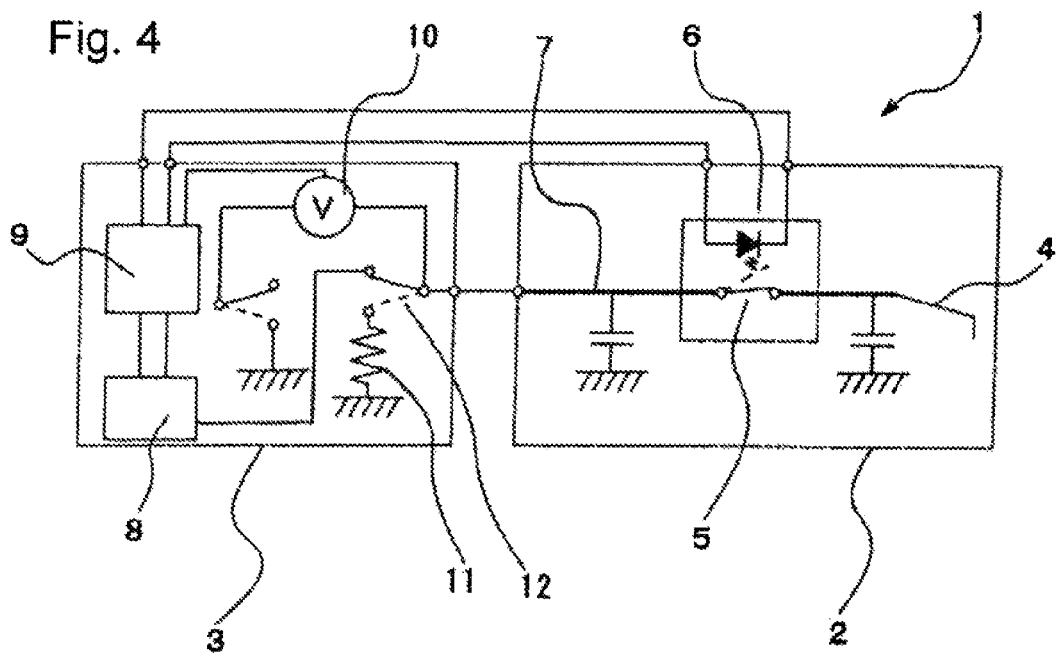
FIG. 4 is a diagram of the probe card test system showing a charging state with the relay turned on, FIG. 5 is a diagram of the probe card test system showing a discharging state with the relay turned on, FIG. 6 is a graph showing an output voltage change at the time of discharging in an RC series circuit.

When the discharge is finished, the first relay controller 6 is caused to operate by the control board 9 to turn on the first relay 5, and the first measurement channel 7 is connected to the DC power supply 8 by the first changeover switch 12 (state shown in FIG. 4). Then, a voltage is applied to the first measurement channel 7 again to charge the capacitance.

Figure 5:
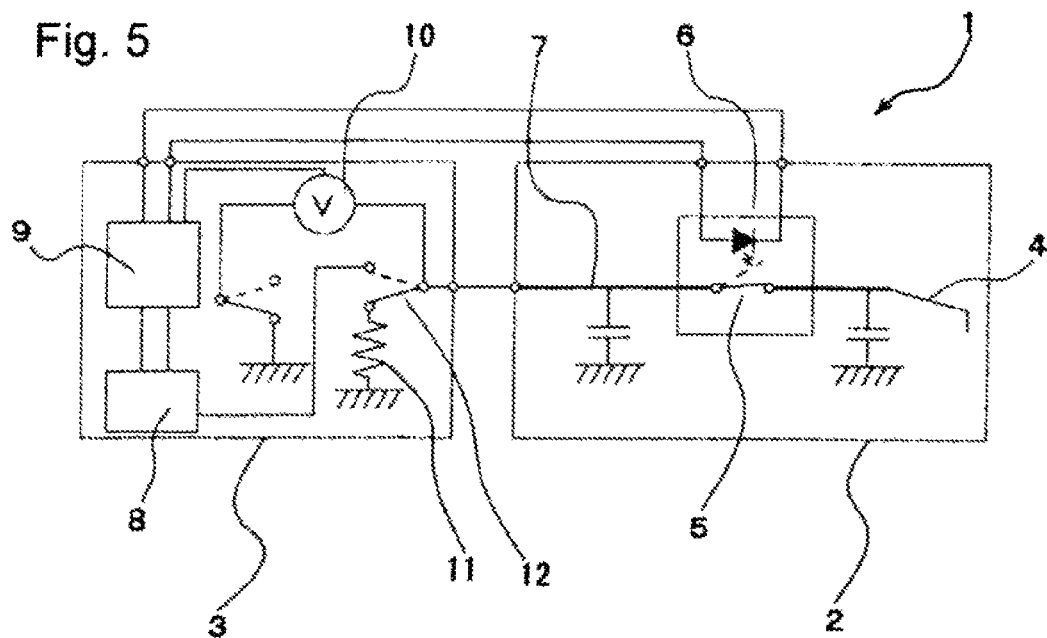

When the capacitance is charged again, the first measurement channel 7 is switched by the first changeover switch 12 from the connection to the DC power supply 8 to that to the first range resistor 11 and the discharge is started in a state shown in FIG. 5. Simultaneously with the start of the discharge, the discharge voltage during a specified time is measured by the voltmeter 10, several time and voltage data are sampled to obtain a discharge equation by the least-square method and an electrostatic capacitance Con when the first relay 5 is turned on is calculated.

A conductor length of the first measurement channel 7 changes by turning on and off the first relay 5 and the electrostatic capacitance changes according to a change of the conductor length. Thus, the electrostatic capacitance Con when the first relay 5 is on and the electrostatic capacitance Coff when the first relay 5 is off are different. In the present invention, whether or not a relay operation is good is determined using this difference in the electrostatic capacitance.

Accordingly, the control board 9 calculates a difference ($\Delta C$) between the thus obtained electrostatic capacitance Con when the first relay 5 is on and electrostatic capacitance Coff when the first relay 5 is off and compares this electrostatic capacitance difference ($\Delta C$) with a pre-calculated electrostatic capacitance difference when the first relay normally operates to determine whether or not the relay operation is good.

Figure 6:
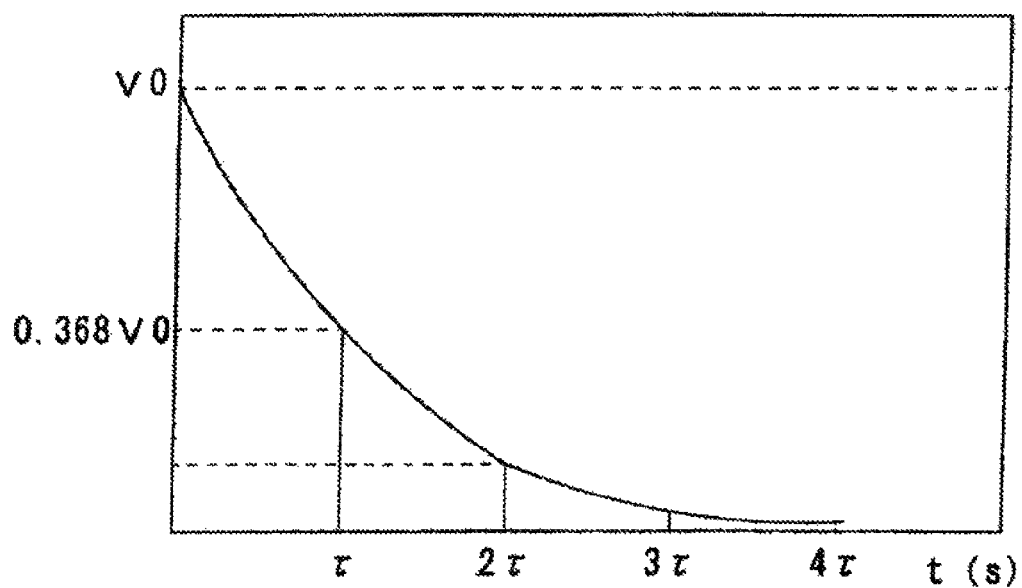

An electrostatic capacitance measurement principle is described. What is shown in FIG. 6 is an output voltage change at the time of discharging in an RC series circuit, and the voltage change at this time can be expressed by the following equation 1 if $Vd(t)$, $V0$, $t$ and $\tau$ denote output voltage at the time of discharging, initial voltage, time and time constant $$Vd(t) = V0 \cdot e^{(-t/\tau)} \qquad \text{Equation 1}$$

When $\tau = C \cdot R$ (C: electrostatic capacitance, R: resistance) and the resistance R is fixed, the time constant t is, of course, also fixed. Further, when $t=\tau$, the equation $1=0.368 V0$ and the time constant t means a time when a discharge voltage is reduced by 36.8% from the initial voltage.

If the equation 1 is transformed into an equation of the time constant $\tau$, the following equation 2 is obtained.

$$\begin{aligned}
Vd(t) &= V0 \cdot e^{-(t/\tau)} \qquad \text{Equation 2}\\
\log_e[Vd(t) &= \log_e[V0 \cdot e^{-(t/\tau)}]\\
\log_e[Vd(t)] &= \log_e V0 + \log_e e^{-(t/\tau)}]\\
\log_e[Vd(t)] &= \log_e V0 - (t/\tau)\\
(t - \tau) &= \log_e V0 - \log_e[Vd(t)]\\
\tau &= \frac{t}{\log_e V0 - \log_e[Vd(t)]}
\end{aligned}$$

Further, if the initial voltage V0 is 3.3 V, the following equation 3 is obtained.

$$\tau = \frac{t}{1.194 - \log_e[Vd(t)]} \quad \text{Equation 3}$$

Accordingly, the time constant τ is obtained by measuring the discharge voltage Vd(t) at an arbitrary time t and the electrostatic capacitance C is obtained by C=τ/R if the resistance R is known. However, an ideal time-discharge voltage relationship cannot be actually obtained by one measurement due to influence of noise. Thus, several time and discharge voltage data are sampled and a discharge equation, i.e. equation 3 is obtained using the least-square method to calculate C. Since an ideal pattern electrostatic capacitance C of the probe card to be measured is in an order of 10 (pF) in a signal line, the resistance R is 1 (GΩ) if the time constant τ is set at 10 (ms). On the other hand, a pattern resistance of the substrate of the probe card can be basically ignored since being very small.

Accordingly, electrostatic capacitances C having different magnitudes (orders of magnitude) can be measured by providing several resistances having different magnitudes (orders of magnitude) and selecting suitable ones out of them. At this time, the provided several resistances R constitute the first range resistor 11 described above.

The present invention can perform relay driving tests in a relay mounted state for a number of relays mounted on the probe card without contacting a needle tip by performing the relay driving tests using the electrostatic capacitance obtained by the measurement principle described above, and can find out mounting failures of the relays and defective products.

To automatically perform these tests, all the operations described above are incorporated as a program into the tester 3 and a plurality of mounted relays are simultaneously or successively tested, whereby the tests can be automatically and continuously performed using the tester of the probe card test system without using a new device. Thus, testing efficiency is drastically improved and better effects can be brought about.

Figure 7:
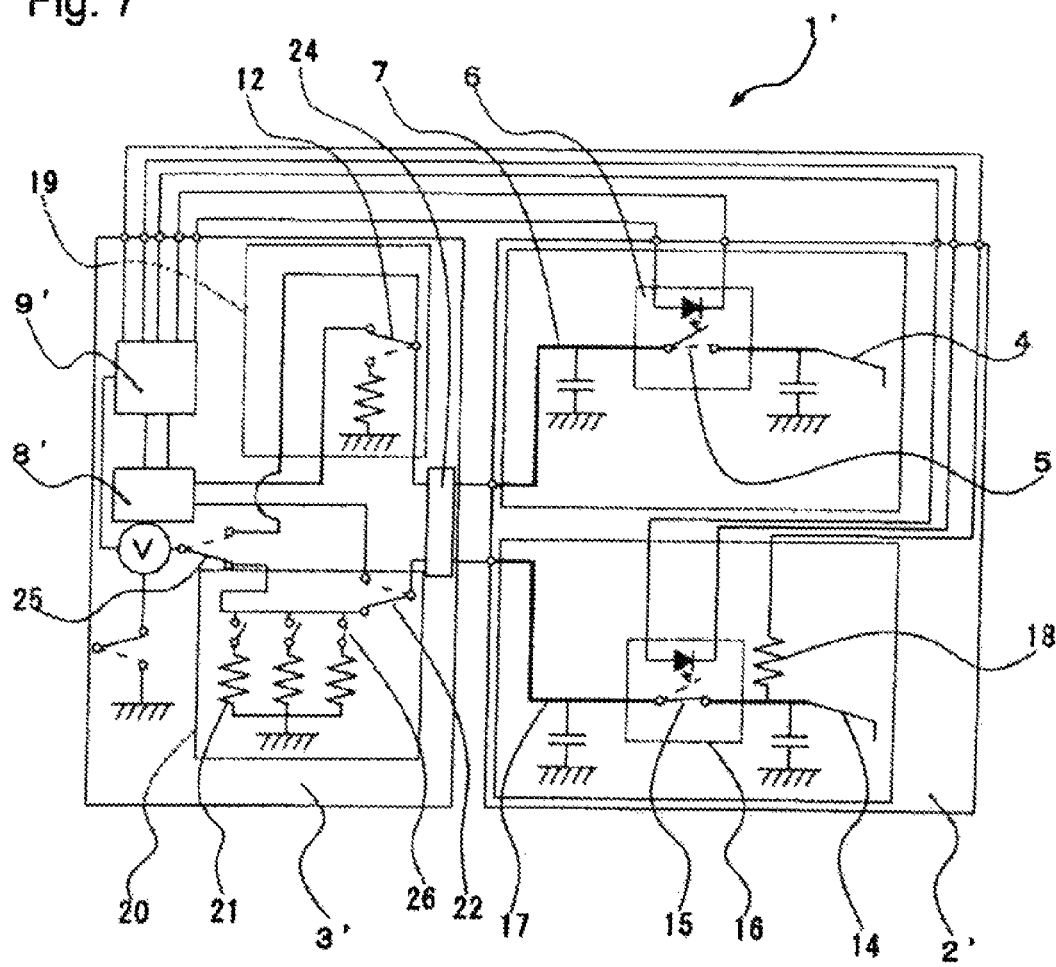
FIG. 7 is a diagram of a probe card test system according to a second embodiment of the present invention showing a state where a resistance value of a pull-up resistor is measured with a relay turned off.

A case of performing a relay driving test of a probe card including a circuit in which a pull-up resistor is arranged in a measurement channel is described next. First, a probe card test system 1' using a probe card including a circuit in which a pull-up resistor is arranged between a relay and a probe is described. What is shown in FIG. 1 is a schematic construction diagram of the probe card test system 1' according to a second embodiment, and what is shown in FIG. 7 is a diagram of the probe card test system 1' according to the second embodiment.

The probe card test system 1' of this embodiment includes a probe card 2' and a tester 3', and the probe card 2' includes a substrate 13' having a first probe 4 and a second probe 14. A first relay 5 connected to the first probe 4, a first relay controller 6 for the first relay 5, a first measurement channel 7 to be connected to the first relay 5, a second relay 15 connected to the second probe 14, a second relay controller 16 for the second relay 15, a pull-up resistor 18 provided between the second relay 15 and the second probe 14 and a second measurement channel 17 to be connected to the second relay 15 are provided on the substrate 13'.

The tester 3' includes a DC power supply 8', a control board 9', a voltmeter 10', a first measurement circuit 19 and a second measurement circuit 20. The first measurement circuit 19 includes a first range resistor 11 having a predetermined time constant and a first changeover switch 12, and the second measurement circuit 20 includes a second range resistor 21 having a predetermined time constant and a second changeover switch 22. The second range resistor 21 is structured such that a plurality of range resistances having different magnitudes can be switched by a resistance changeover switch 26 so that a suitable range resistance can be selected according to a measurement object.

The DC power supply 8' is composed of a DC power supply of 3.3 V and a DC power supply of 5 V and connected to the control board 9, the first measurement channel 7 and the second measurement channel 17. The DC power supply of 3.3 V is connected to the first measurement channel 7 via the first changeover switch 12, and the DC power supply of 5 V is connected to the second measurement channel 17 via the second changeover switch 22. The DC power supply 8' is also used as a power supply for the pull-up resistor 18 and that for the first and second relays 5, 15, wherein the DC power supply of 5 V is used as the power supply for the pull-up resistor 18.

The first measurement circuit 19 is connected to the first measurement channel 7, and the second measurement circuit 20 is connected to the second measurement channel 17. Thus, connection of the tester 3' and the probe card 2' has to be switched, wherefore a switch control board 24 is provided in the tester 3' to switch between the connection of the first measurement circuit 19 and the first measurement channel 7 and that of the second measurement circuit 20 and the second measurement channel 17.

Since voltages of the first measurement circuit 19 and the second measurement circuit 20 are measured by the voltmeter 10', a circuit changeover switch 25 is provided to switch between connection of the voltmeter 10' to the first measurement circuit 19 and that of the voltmeter 10' to the second measurement circuit 20.

The control board 9' controls the operations of the first and second relay controllers 6, 16 to switch on and off states of the first and second relays 5, 15. Further, the control board 9' controls the changeover switch 24 and the first and second changeover switches 12, 22 and operates in tandem with the switch control board 24.

The first changeover switch 12 is provided to switch between connection of the first measurement channel 7 to the DC power supply of 3.3 V of the DC power supply 8' and that to the first range resistor 11, and the second changeover switch 22 is provided to switch between connection of the second measurement channel 17 to the DC power supply of 5 V of the DC power supply 8' and that to the second range resistor 21.

The voltmeter 10 is connected to the first measurement channel 7 and measures a voltage when the first measurement channel 7 is connected to the first range resistor 11 by the first changeover switch 12. Further, the voltmeter 10 is connected to the second measurement channel 17 and measures a voltage when the second measurement channel 17 is connected to the second range resistor 21 by the second changeover switch 22.

By constructing the probe card test system 1' as described above, even if the second measurement channel 17 using the pull-up resistor 18 is present on the probe card 2', relay driving tests can be automatically and continuously performed with the relays mounted on the probe card 2'. A relay driving test method of the probe card test system 1' is described in detail below.

In the relay driving test method for the first measurement channel 7 of the probe card 2', as in the first embodiment, a difference (ΔC) between an electrostatic capacitance Con when the first relay 5 is on and an electrostatic capacitance Coff when the first relay 5 is off is calculated and compared with a pre-calculated electrostatic capacitance difference when the first relay normally operates to determine whether or not a relay operation is good.

To this end, the first measurement channel 7 and the first measurement circuit 19 are connected by the switch control board 24 and the voltmeter 10' is connected to the first measurement circuit 19 by the circuit changeover switch 25. Thereafter, by a method as in the first embodiment, the difference (ΔC) between the electrostatic capacitance Con when the first relay 5 is on and the electrostatic capacitance Coff when the first relay 5 is off is calculated and whether or not a relay operation is good is determined.

Next, a relay driving test method for the second measurement channel 17 of the probe card 2' is described. First, the second measurement channel 17 and the second measurement circuit 20 are connected by the switch control board 24 and the voltmeter 10' is connected to the second measurement circuit 20 by the circuit changeover switch 25.

In this state, a resistance value of the pull-up resistor 18 is measured. Since a switch resistance r1 of the tester 3' causes an error at the time of a measurement, the switch resistance r1 is measured beforehand to be canceled at the time of measuring the resistance value of the pull-up resistor 18.

To measure the resistance value of the pull-up resistor 18, the second relay 15 is turned on by the control board 9' and the second measurement channel 17 is connected to the voltmeter 10' by the second changeover switch 22 as shown in FIG. 7. Further, the range resistor 21 is connected to a range resistance having a suitable magnitude by the resistance changeover switch 26. Since a switch resistance r2 of the resistance changeover switch 26 also causes a measurement error of the resistance value of the pull-up resistor 18, it is measured beforehand to be canceled.

In the state as described above, a voltage Vout divided by the pull-up resistor 18 and the range resistor 21 is measured by the voltmeter 10'. If V0, R1 and R2 denote the voltage of the DC power supply connected to the pull-up resistor 18, the resistance value of the pull-up resistor 18 and the resistance value of the range resistor 21, the resistance value R1 of the pull-up resistor 18 is obtained from the voltage Vout measured by the voltmeter 10' using the following equation.

$$R1=(V0/Vout-1)\times(R2+r2)-r1 \qquad \text{Equation 4}$$

The thus obtained resistance value R1 of the pull-up resistor 18 is compared with the specification of the probe card 2' to judge whether or not the resistance value of the pull-up resistor 18 is good. Since the resistance value R1 of the pull-up resistor 18 is measured via the second relay 15, the relay operation of the second relay 15 is also judged to be OK if the measurement result of the resistance value R1 of the pull-up resistor 18 is good.

The relay driving test can be performed for the probe card in the relay mounted state also when the pull-up resistor 18 is arranged closer to the second probe 14 than the second relay 15 in the second measurement channel 17 on the substrate 13' of the probe card 2'.

Figure 8:
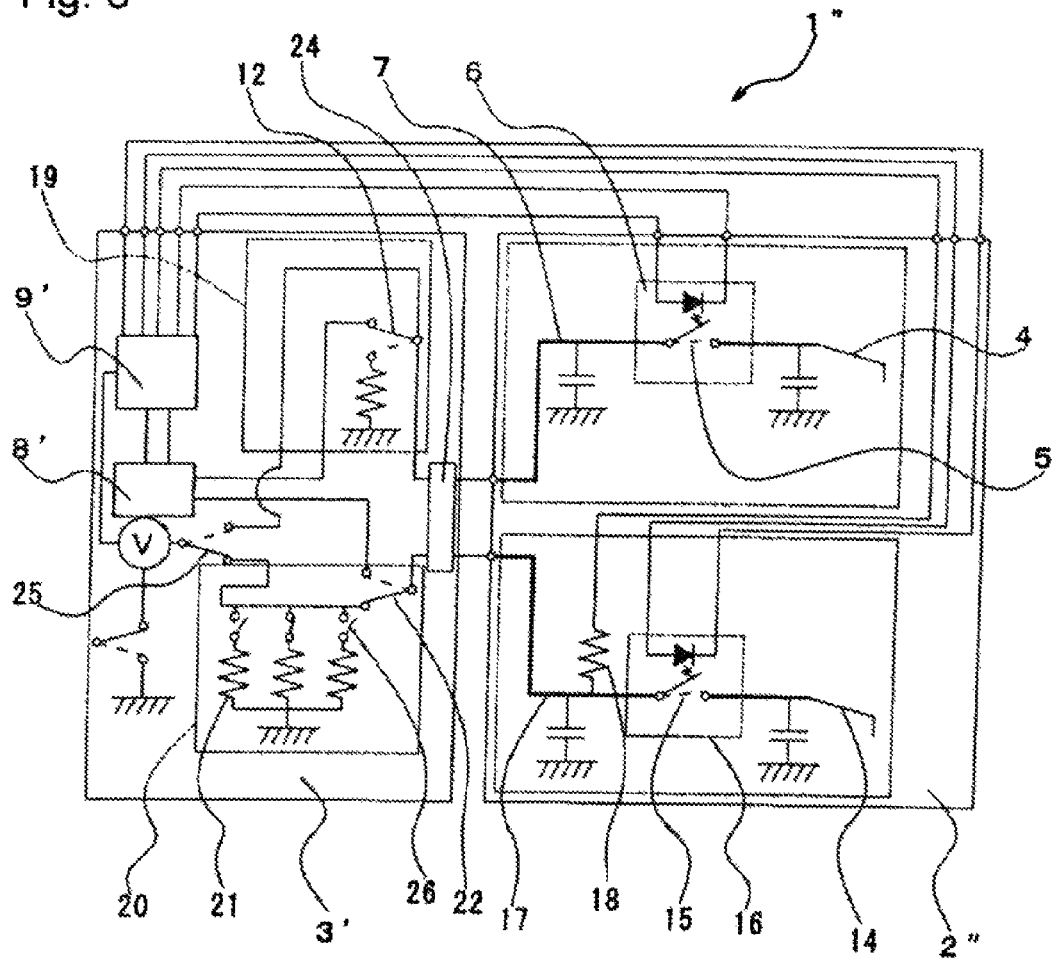
FIG. 8 is a diagram of a probe card test system according to a third embodiment of the present invention showing a state where a resistance value of a pull-up resistor is measured with a relay turned off.

Next, a probe card test system 1" using a probe card including a circuit in which a pull-up resistor is arranged closer to a tester 3' than a second relay 15 is described. What is shown in FIG. 1 is a schematic construction diagram of the probe card test system 1" according to a third embodiment, and what is shown in FIG. 8 is a diagram of the probe card test system 1" according to the third embodiment.

The probe card test system 1" of this embodiment includes a probe card 2" and a tester 3', and the probe card 2" includes a substrate 13' having a first probe 4 and a second probe 14. A first relay 5 connected to the first probe 4, a first relay controller 6 for the first relay 5, a first measurement channel 7 to be connected to the first relay 5, a second relay 15 connected to the second probe 14, a second relay controller 16 for the second relay 15, a pull-up resistor 18 provided closer to the tester 3' than the second relay 15 and a second measurement channel 17 to be connected to the second relay 15 are provided on the substrate 13'.

The tester 3' has the same structure as the tester 3' in the second embodiment and includes a DC power supply 8', a control board 9', a voltmeter 10', a first measurement circuit 19 and a second measurement circuit 20'. The first measurement circuit 19 includes a first range resistor 11 having a predetermined time constant and a first changeover switch 12, and the second measurement circuit 20 includes a second range resistor 21 having a predetermined time constant and a second changeover switch 22. The second range resistor 21 is structured such that a plurality of range resistances having different magnitudes can be switched by a resistance changeover switch 26 so that a suitable range resistance can be selected according to a measurement object.

The DC power supply 8' is composed of a DC power supply of 3.3 V and a DC power supply of 5 V and connected to the control board 9, the first measurement channel 7 and the second measurement channel 17. The DC power supply of 3.3 V is connected to the first measurement channel 7 via the first changeover switch 12, and the DC power supply of 5 V is connected to the second measurement channel 17 via the second changeover switch 22. The DC power supply 8' is also used as a power supply for the pull-up resistor 18 and that for the first and second relays 5, 15, wherein the DC power supply of 5 V is used as the power supply for the pull-up resistor 18.

The first measurement circuit 19 is connected to the first measurement channel 7, and the second measurement circuit 20 is connected to the second measurement channel 17. Thus, connection of the tester 3' and the probe card 2' has to be switched, wherefore a switch control board 24 is provided in the tester 3' to switch between connection of the first measurement circuit 19 and the first measurement channel 7 and that of the second measurement circuit 20 and the second measurement channel 17.

Since voltages of the first measurement circuit 19 and the second measurement circuit 20 are measured by the voltmeter 10', a circuit changeover switch 25 is provided to switchingly connect the voltmeter 10' to the first measurement circuit 19 or the second measurement circuit 20.

The control board 9' controls the operations of the first and second relay controllers 6, 16 to switch on and off states of the first and second relays 5, 15. Further, the control board 9' controls the changeover switch 24 and the first and second changeover switches 12, 22 and operates in tandem with the switch control board 24.

The first changeover switch 12 is provided to switch between connection of the first measurement channel 7 to the DC power supply of 3.3 V of the DC power supply 8' and that to the first range resistor 11, and the second changeover switch 22 is provided to switch between connection of the second measurement channel 17 to the DC power supply of 5 V of the DC power supply 8' and that to the second range resistor 21.

The voltmeter 10 is connected to the first measurement channel 7 and measures a voltage when the first measurement channel 7 is connected to the first range resistor 11 by the first changeover switch 12. Further, the voltmeter 10 is connected to the second measurement channel 17 and measures a voltage when the second measurement channel 17 is connected to the second range resistor 21 by the second changeover switch 22.

By constructing the probe card test system 1'' as described above, even if the second measurement channel 17 using the pull-up resistor 18 is present on the probe card 2', relay driving tests can be automatically and continuously performed with the relays mounted on the probe card 2'. A relay driving test method of the probe card test system 1' is described in detail below.

In the relay driving test method for the first measurement channel 7 of the probe card 2'', as in the first embodiment, a difference (ΔC) between an electrostatic capacitance Con when the first relay 5 is on and an electrostatic capacitance Coff when the first relay 5 is off is calculated and compared with a pre-calculated electrostatic capacitance difference when the first relay normally operates to determine whether or not a relay operation is good.

To this end, as in the second embodiment, the first measurement channel 7 and the first measurement circuit 19 are connected by the switch control board 24 and the voltmeter 10' is connected to the first measurement circuit 19 by the changeover switch 25. Thereafter, by a method as in the first embodiment, the difference (ΔC) between the electrostatic capacitance Con when the first relay 5 is on and the electrostatic capacitance Coff when the first relay 5 is off is calculated and whether or not a relay operation is good is determined.

Next, a relay driving test method for the second measurement channel 17' of the probe card 2'' is described. First, as shown in FIG. 8, the second measurement channel 17 and the second measurement circuit 20 are connected by the switch control board 24 and the voltmeter 10' is connected to the second measurement circuit 20 by the changeover switch 25.

In this state, a resistance value of the pull-up resistor 18 is measured. A method for measuring the resistance value of the pull-up resistor 18 is as in the second embodiment. Since a switch resistance r1 of the tester 3' and a switch resistance r2 of the resistance changeover switch 26 for switching the range resistor 21 cause an error at the time of a measurement, the switch resistances r1, r2 are measured beforehand to be canceled at the time of measuring the resistance value of the pull-up resistor 18.

To measure the resistance value of the pull-up resistor 18, the second relay 15 is turned off by the control board 9' and the second measurement channel 17 is connected to the voltmeter 10' by the second changeover switch 22 as shown in FIG. 8. Further, the range resistor 21 is connected to a range resistance having a suitable magnitude by the resistance changeover switch 26.

In the state as described above, a voltage Vout divided by the pull-up resistor 18 and the range resistor 21 is measured by the voltmeter 10'. If V0, R1 and R2 denote the voltage of the DC power supply connected to the pull-up resistor 18, the resistance value of the pull-up resistor 18 and the resistance value of the range resistor 21, the resistance value R1 of the pull-up resistor 18 is obtained from the voltage Vout measured by the voltmeter 10' using the above equation 4.

The thus obtained resistance value R1 of the pull-up resistor 18 is compared with the specification of the probe card 2' to judge whether or not the resistance value of the pull-up resistor 18 is good. If there is no problem in the resistance value R1 of the pull-up resistor 18, the next stage follows.

Also in this embodiment, basically as in the case where there is no pull-up resistor, a difference (ΔC) between an electrostatic capacitance Con when the second relay 15 is on and an electrostatic capacitance Coff when the second relay 15 is off is calculated and compared with a pre-calculated electrostatic capacitance difference when the second relay normally operates to determine whether or not a relay operation is good.

Figure 9:
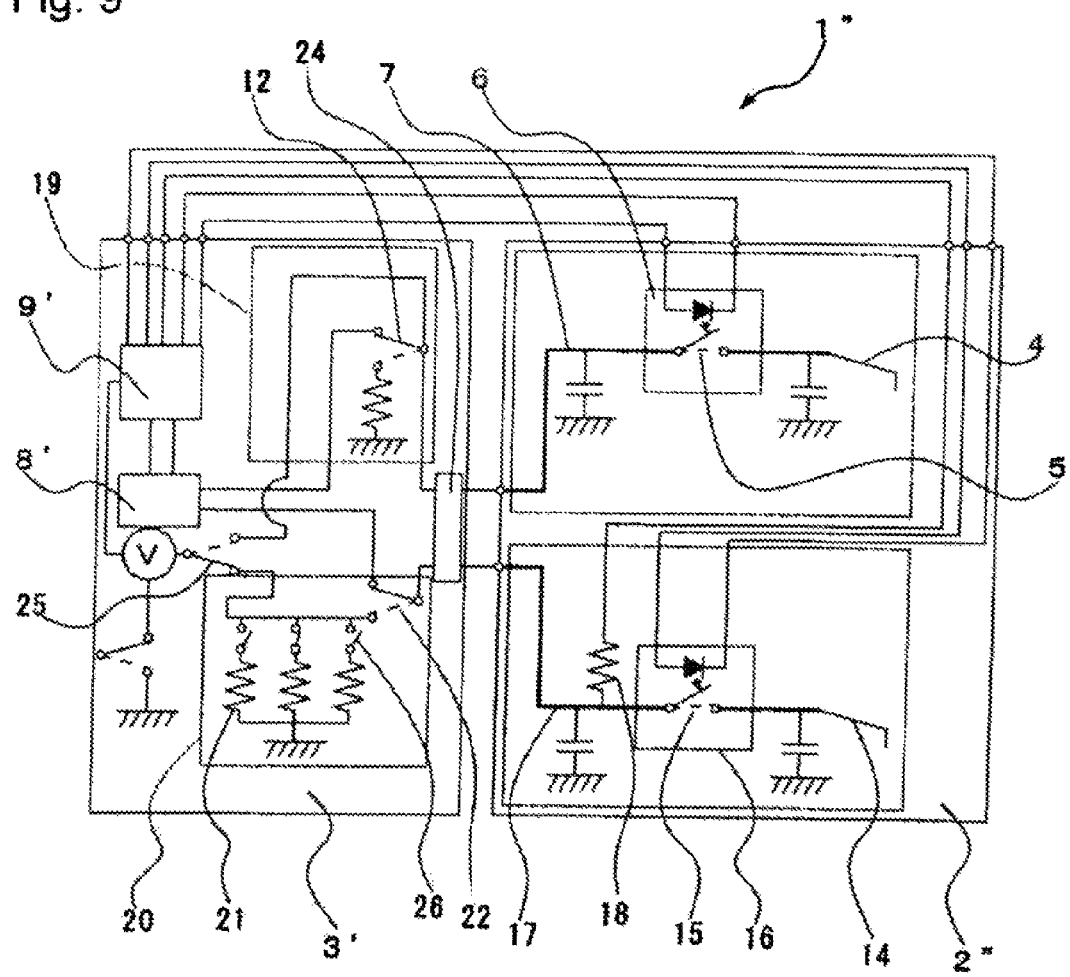

A voltage of 5 V is applied between the second measurement channel 17 and a GND to charge a capacitance with the second relay 15 turned off and the second measurement channel 17 connected to the DC power supply 8' by the second changeover switch 22 (state shown in FIG. 9). The capacitance is the sum of a line capacitance, i.e. so-called stray capacitance and a capacitance of a capacitor mounted as a part.

When the capacitance is charged, the connection of the second measurement channel 17 is switched from the connection to the DC power supply 8' to that to the second range resistor 21 by the second changeover switch 22, whereupon discharge is performed with a time constant τ(=C*R) determined by a combined resistance R of the resistance value R1 of the pull-up resistor 18 and the resistance value R2 of the range resistor 21 and an electrostatic capacitance C until V=V2 is reached.

Figure 10:
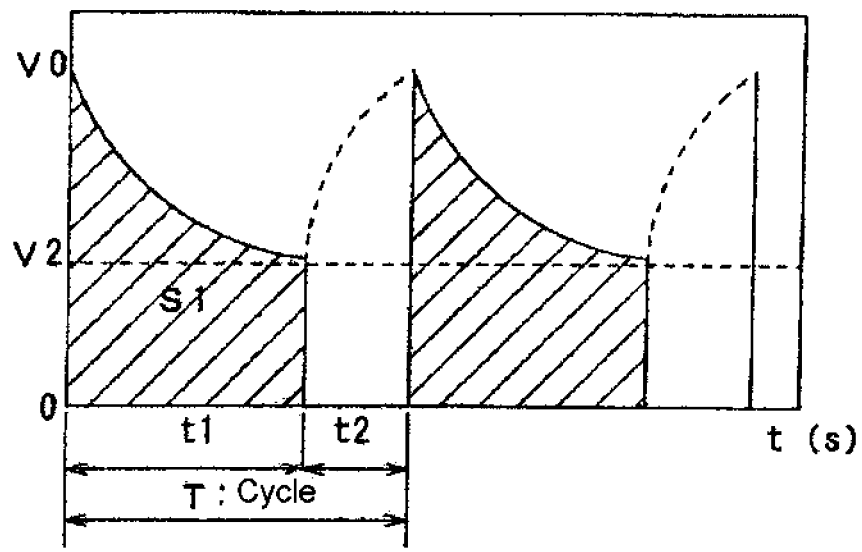
FIG. 10(a) is a graph of an output voltage and FIG. 10(b) is a graph of an input voltage.
Figure 10:
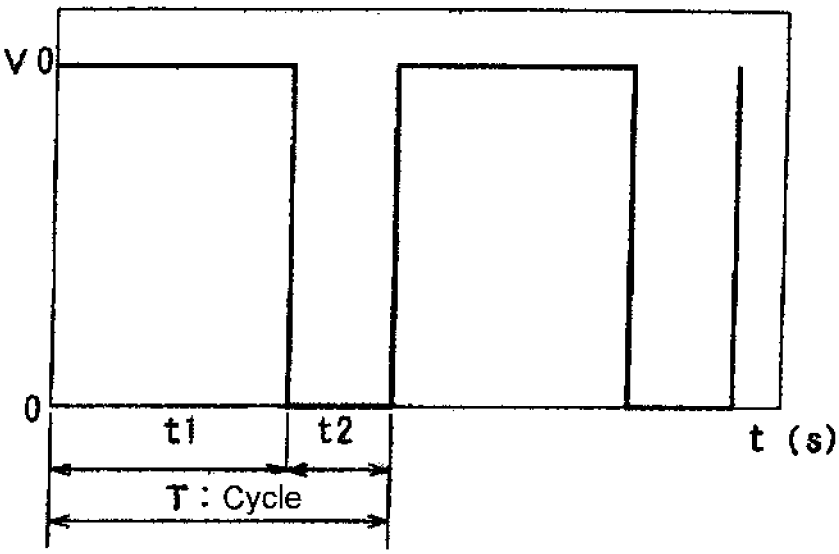

If the second changeover switch 22 is switched in a predetermined cycle, the output voltage Vout measured by the voltmeter 10' cyclically changes as shown in FIG. 10(a). An area S1 obtained by integrating the output voltage Vout over the time t depends on the electrostatic capacitance Coff when the second relay 15 is off.

Figure 11:
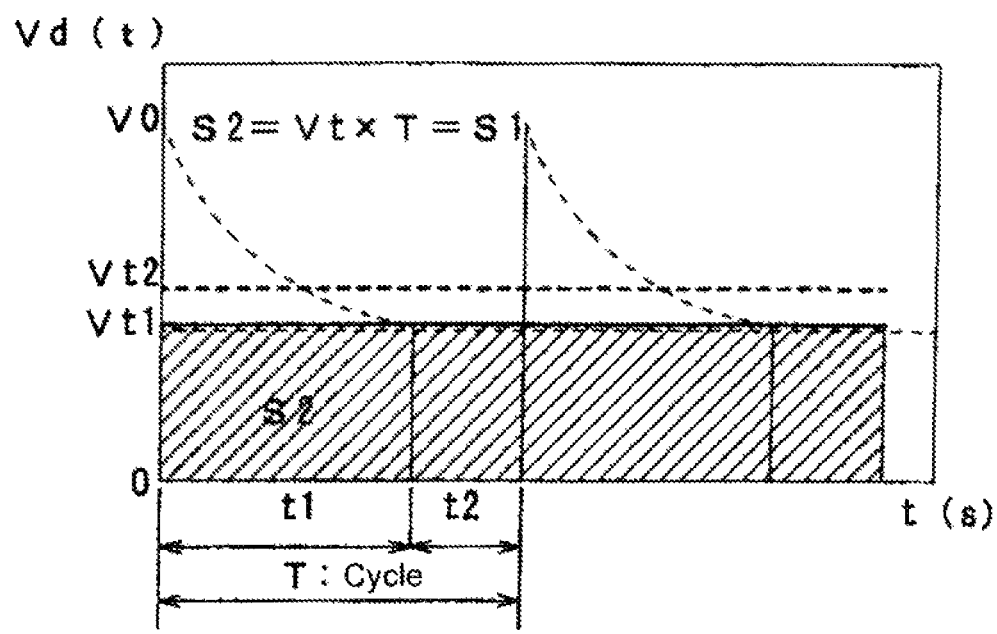
FIG. 11 is a graph showing an average voltage in the probe card test system according to the third embodiment.

If the above voltage measurement is conducted by a voltmeter in which large loads are connected in series, a voltage change is averaged (becomes a direct current) and a substantially constant voltage is measured as shown in FIG. 11. Accordingly, average voltages Vt (average voltage Vt1 when the second relay 15 is turned off, average voltage Vt2 when the second relay 15 is turned on) dependent on the electrostatic capacitance C similar to S1 are measured.

Voltage desired to be calculated:      Equation 5

$$V_t = \frac{1}{T} \cdot \{V_1 \cdot \tau(1 - e^{-t_1/\tau}) + V_2 \cdot t_1\}$$

Here, $\tau = C \cdot R$ $$R = \frac{R_1 \cdot (r_1 + R_2 + r_2)}{R_1 + (r_1 + R_2 + r_2)} = \frac{R_1 \cdot (R_2 + r_1 + r_2)}{R_1 + R_2 + r_1 + r_2}$$

$$V_1 = \frac{V_0 \cdot R_1}{R_1 + r_1 + R_2 + r_2} = \frac{V_0 \cdot R_1}{R_1 + R_2 + r_1 + r_2}$$

$$V_2 = \frac{V_0 \cdot (r_1 + R_2 + r_2)}{R_1 + r_1 + R_2 + r_2} = \frac{V_0 \cdot (R_2 + r_1 + r_2)}{R_1 + R_2 + r_1 + r_2}$$

Voltage to be measured:

$$V_m = \frac{V_T \cdot (R_2 + r_2)}{r_1 + R_2 + r_2} = \frac{V_T \cdot (R_2 + r_2)}{R_2 + r_1 + r_2} = K \cdot V_t$$

Here, $K = \frac{R_2 + r_2}{R_2 + r_1 + r_2}$

The average voltage Vt is calculated by an average voltage equation as shown in the equation 5. This equation ignores a switch ON resistance, but a relationship expressed by equation 5 holds for a measured voltage Vm of an actual circuit taking a switch ON resistance into consideration. Thus, the electrostatic capacitance Coff when the second relay 15 is turned off and the electrostatic capacitance Con when the second relay 15 are turned on are calculated from a measured average voltage Vm1 when the second relay 15 is turned off and a measured average voltage Vm2 when the second relay 15 is turned on using numerical computation by the Newton's method.

A difference (ΔC) between the thus calculated electrostatic capacitance Con when the second relay 15 is on and electrostatic capacitance Coff when the second relay 15 is off is calculated and compared with a pre-calculated electrostatic capacitance difference when the second relay normally operates to determine whether or not a relay operation is good.

In this way, a relay driving test can be performed for the probe card in a relay mounted state even if the pull-up resistor 18 is arranged closer to the tester 3' than the second relay 15 in the second measurement channel 17 on the substrate 13' of the probe card 2'.

| Reference Signs List | |
|---|---|
| 1, 1', 1" | probe card test system |
| 2, 2', 2" | probe card |
| 3, 3' | tester |
| 4 | first probe |
| 5 | first relay |
| 6 | first relay controller |
| 7 | first measurement channel |
| 8, 8' | DC power source |
| 9 | control board |
| 10, 10' | voltmeter |
| 11 | first range resistor |
| 12 | first changeover switch |
| 13, 13' | substrate |
| 14 | second probe |
| 15 | second relay |
| 16 | second relay controller |
| 17 | second measurement channel |
| 18 | pull-up resistor |
| 19 | first measurement circuit |
| 20 | second measurement circuit |
| 21 | second range resistor |
| 22 | second changeover switch |
| 24 | switch control board |
| 25 | circuit changeover switch |
| 26 | resistance changeover switch |

The invention claimed is:

1. A probe card test system for testing a probe card using a tester, characterized in that:
the probe card includes a substrate having a first probe and a first relay connected to the first probe, a relay controller for the first relay and a first measurement channel for connecting the first relay and the first probe to the tester are further provided on the substrate;
the tester includes a DC power source, a control board for controlling the relay controller for the first relay, and a first measurement circuit to be connected to the first measurement channel, the DC power source and a voltmeter; and
the first measurement circuit includes a first resistor having a predetermined time constant and a first changeover switch to be connected to the first measurement channel, the DC power source and the first resistor are connected to the first changeover switch, and the first measurement channel is switchingly connected to the DC power source or the first resistor by the first changeover switch.

2. The probe card test system according to claim 1, wherein:
a second probe, a second relay connected to the second probe, a relay controller for the second relay and a second measurement channel for connecting the second relay and the second probe to the tester are provided on the substrate of the probe card, and a pull-up resistor is arranged between the second relay and the second probe in the second measurement channel;
the tester includes a second measurement circuit with a second resistor having a predetermined time constant and a second changeover switch to be connected to the second measurement channel, the second measurement circuit is connected to the DC power source and the voltmeter, the DC power source and the second resistor are connected to the second changeover switch, and the second measurement channel is switchingly connected to the DC power source or the second resistor by the second changeover switch;
the tester further includes a circuit changeover switch for switching between connection of the first measurement circuit and the voltmeter and connection of the second measurement circuit and the voltmeter and a switch control board for switching connections of the first and second measurement circuits and the first and second channels.

3. The probe card test system according to claim 1, wherein:
a second probe, a second relay connected to the second probe, a relay controller for the second relay and a second measurement channel for connecting the second relay and the second probe to the tester are provided on the substrate of the probe card, and a pull-up resistor is arranged between the second relay and the tester in the second measurement channel;
the tester includes a second measurement circuit with a second resistor having a predetermined time constant and a second changeover switch to be connected to the second measurement channel, the second measurement circuit is connected to the DC power source and the voltmeter, the DC power source and the second resistor are connected to the second changeover switch, and the second measurement channel is switchingly connected to the DC power source or the second resistor by the second changeover switch;
the tester further includes a circuit changeover switch for switching between connection of the first measurement circuit and the voltmeter and connection of the second measurement circuit and the voltmeter and a switch control board for switching connections of the first and second measurement circuits and the first and second channels.

4. A relay driving test method for a probe card using a tester, characterized in that:
the probe card includes a substrate having a first probe and a first relay connected to the first probe, a relay controller for the first relay and a first measurement channel for connecting the first relay and the first probe to the tester are further provided on the substrate;
the tester includes a DC power source, a control board for controlling the relay controller for the first relay, a first measurement circuit to be connected to the first measurement channel, the DC power source and a voltmeter;
the first measurement circuit includes a first resistor having a predetermined time constant and a first changeover switch to be connected to the first measurement channel, the DC power source and the first resistor are connected to the first changeover switch, and the first measurement channel is switchingly connected to the DC power source or the first resistor by the first changeover switch,
a capacitance is charged by turning off the first relay, connecting the first measurement channel to the DC power supply by the first changeover switch and applying a voltage between the first measurement channel and a GND;

after charge, the first measurement channel is connected to the first resistor by the first changeover switch to start discharge, time measurement is started simultaneously with the start of the discharge, a discharge voltage during a specified period is measured by the voltmeter, several time and voltage data are sampled to obtain a discharge equation by a least-square method and calculate an electrostatic capacitance Coff when the first relay is turned off;

after the completion of the discharge, the capacitance is charged by turning on the first relay by the control board, connecting the first measurement channel to the DC power supply by the first changeover switch and applying a voltage between the first measurement channel and the GND;

after charge, the first measurement channel is connected to the first resistor by the first changeover switch to start discharge, time measurement is started simultaneously with the start of the discharge, a discharge voltage during a specified period is measured by the voltmeter, and several time and voltage data are sampled to calculate an electrostatic capacitance Con when the relay is turned on; and a difference between the electrostatic capacitance Con when the first relay is turned on and the electrostatic capacitance Coff when the first relay is turned off is calculated to determine whether or not the operation of the first relay is good.

5. The relay driving test method for the probe card according to claim 4, wherein:

a second probe, a second relay connected to the second probe, a relay controller for the second relay and a second measurement channel for connecting the second relay and the second probe to the tester are provided on the substrate of the probe card, and a pull-up resistor is arranged between the second relay and the second probe in the second measurement channel;

the tester includes a second measurement circuit with a second resistor having a predetermined time constant and a second changeover switch to be connected to the second measurement channel, the second measurement circuit is connected to the DC power source and the voltmeter, the DC power source and the second resistor are connected to the second changeover switch, and the second measurement channel is switchingly connected to the DC power source or the second resistor by the second changeover switch;

the tester further includes a circuit changeover switch for switching between connection of the first measurement circuit and the voltmeter and connection of the second measurement circuit and the voltmeter and a switch control board for switching connections of the first and second measurement circuits and the first and second channels;

a resistance value of the pull-up resistor is calculated by connecting the second measurement circuit of the tester and the second measurement channel of the probe card by the switch control board, connecting the second measurement circuit to the voltmeter by the circuit changeover device, turning on the second relay and connecting the second measurement channel to the second resistor by the second changeover switch, and whether or not the operation of the second relay is good is determined based on the calculated resistance value.

6. The relay driving test method for the probe card according to claim 4, wherein:

a second probe, a second relay connected to the second probe, a relay controller for the second relay and a second measurement channel for connecting the second relay and the second probe to the tester are provided on the substrate of the probe card, and a pull-up resistor is arranged between the second relay and the tester in the second measurement channel;

the tester includes a second measurement circuit with a second resistor having a predetermined time constant and a second changeover switch to be connected to the second measurement channel, the second measurement circuit is connected to the DC power source and the voltmeter, the DC power source and the second resistor are connected to the second changeover switch, and the second measurement channel is switchingly connected to the DC power source or the second resistor by the second changeover switch;

the tester further includes a circuit changeover switch for switching between connection of the first measurement circuit and the voltmeter and connection of the second measurement circuit and the voltmeter and a switch control board for switching connections of the first and second measurement circuits and the first and second channels;

a resistance value of the pull-up resistor is calculated by connecting the second measurement circuit of the tester and the second measurement channel of the probe card by the switch control board, connecting the second measurement circuit to the voltmeter by the circuit changeover device, turning off the second relay and connecting the second measurement channel to the second resistor by the second changeover switch;

a capacitance is charged by connecting the second measurement channel to the DC power supply by the second changeover switch with the second relay kept turned off and applying a voltage between the second measurement channel and the GND;

after charge, the second measurement channel is connected to the second resistor by the second changeover switch to start discharge for a specified period, a change in a discharge voltage within the specified period is measured by the voltmeter and the capacitance is charged again by connecting the second measurement channel to the DC power supply by the second changeover switch and applying a voltage between the second measurement channel and the GND;

the discharge and the charge are cyclically repeated with the second measurement circuit connected to the voltmeter only during the discharge and an electrostatic capacitance Coff when the second relay is turned off is calculated based on an average voltage obtained by measuring voltages after the elapse of the specified period from the starts of the discharge and the charge using a voltmeter in which relatively large loads are connected in series;

after the calculation of the electrostatic capacitance Coff, the capacitance is charged by turning on the second relay by the control board, connecting the second measurement channel to the DC power supply by the second changeover switch and applying a voltage between the second measurement channel and the GND;

after charge, the second measurement channel is connected to the second resistor by the second changeover switch to start discharge for a specified period, a change in a discharge voltage within the specified period is measured by the voltmeter, and the capacitance is charged again by connecting the second measurement channel to the DC power supply by the second changeover switch and applying a voltage between the second measurement channel and the GND;

the discharge and the charge are cyclically repeated with the second measurement circuit connected to the voltmeter only during the discharge and an electrostatic capacitance Con when the second relay is turned on is calculated based on an average voltage obtained by measuring voltages after the elapse of the specified period from the starts of the discharge and the charge using a voltmeter in which relatively large loads are connected in series; and a difference between the electrostatic capacitance Con when the second relay is turned on and the electrostatic capacitance Coff when the second relay is turned off is calculated to determine whether or not the operation of the second relay is good.

* * * * *